(12) United States Patent
Apalkov et al.

(10) Patent No.: US 8,432,009 B2
(45) Date of Patent: Apr. 30, 2013

(54) METHOD AND SYSTEM FOR PROVIDING MAGNETIC LAYERS HAVING INSERTION LAYERS FOR USE IN SPIN TRANSFER TORQUE MEMORIES

(75) Inventors: Dmytro Apalkov, San Jose, CA (US); Xueti Tang, Fremont, CA (US); Vladimir Nikitin, Campbell, CA (US)

(73) Assignee: Grandis, Inc., San Jose, CA (US)

( * ) Notice: Subject to any disclaimer, the term of this patent is extended or adjusted under 35 U.S.C. 154(b) by 79 days.

(21) Appl. No.: 13/011,849

(22) Filed: Jan. 21, 2011

(65) Prior Publication Data

US 2012/0168885 A1    Jul. 5, 2012

Related U.S. Application Data

(60) Provisional application No. 61/429,041, filed on Dec. 31, 2010.

(51) Int. Cl.
*H01L 29/82* (2006.01)

(52) U.S. Cl.
USPC .......... 257/421; 257/295; 257/E21.665; 438/3; 438/48; 438/71; 438/257; 365/158; 365/171

(58) Field of Classification Search ............ 257/295, 257/421, E21.665, E29.323, E43.004; 438/3, 438/48, 71, 257; 360/324, 324.11, 324.12, 360/324.2; 365/158, 171
See application file for complete search history.

(56) References Cited

U.S. PATENT DOCUMENTS

| | | | |
|---|---|---|---|
| 6,532,164 B2 | 3/2003 | Redon et al. | |
| 6,611,405 B1 | 8/2003 | Inomata et al. | |
| 6,760,243 B2 | 7/2004 | Winograd et al. | |
| 6,829,161 B2 | 12/2004 | Huai et al. | |
| 6,967,863 B2 | 11/2005 | Huai et al. | |
| 6,992,359 B2 | 1/2006 | Huai et al. | |
| 7,057,921 B2 | 6/2006 | Valet | |
| 7,088,609 B2 | 8/2006 | Valet | |
| 7,106,624 B2 | 9/2006 | Huai et al. | |
| 7,161,829 B2 | 1/2007 | Huai et al. | |
| 7,190,611 B2 | 3/2007 | Nguyen et al. | |
| 7,242,045 B2 | 7/2007 | Nguyen et al. | |
| 7,486,551 B1 | 2/2009 | Li et al. | |
| 7,489,541 B2 | 2/2009 | Pakala et al. | |
| 7,502,249 B1 | 3/2009 | Ding | |

(Continued)

OTHER PUBLICATIONS

Japanese abstract of publication No. 11-120758, Apr. 30, 1999, Nonvolatile Random Access Memory, Eric Maiken.

(Continued)

*Primary Examiner* — Evan Pert
*Assistant Examiner* — Mark A Laurenzi
(74) *Attorney, Agent, or Firm* — Convergent Law Group LLP (57) ABSTRACT

A method and system for providing a magnetic junction usable in a magnetic device are described. The magnetic junction includes a pinned layer, a nonmagnetic spacer layer, and a free layer. The nonmagnetic spacer layer is between the pinned layer and the free layer. The magnetic junction is configured such that the free layer is switchable between a plurality of stable magnetic states when a write current is passed through the magnetic junction. At least one of the pinned layer and the free layer includes a magnetic substructure. The magnetic substructure includes at least two magnetic layers interleaved with at least one insertion layer. Each insertion layer includes at least one of Cr, Ta, Ti, W, Ru, V, Cu, Mg, aluminum oxide, and MgO. The magnetic layers are exchange coupled.

38 Claims, 6 Drawing Sheets

U.S. PATENT DOCUMENTS

| | | | |
|---|---|---|---|
| 7,532,505 | B1 | 5/2009 | Ding |
| 7,821,088 | B2 * | 10/2010 | Nguyen et al. ............... 257/421 |
| 7,932,571 | B2 | 4/2011 | Rizzo et al. |
| 2002/0105827 | A1 | 8/2002 | Redon et al. |
| 2003/0007398 | A1 | 1/2003 | Daughton et al. |
| 2003/0059588 | A1 | 3/2003 | Hannah et al. |
| 2003/0227807 | A1 | 12/2003 | Nakamura et al. |
| 2005/0040433 | A1 | 2/2005 | Nozieres et al. |
| 2005/0104101 | A1 * | 5/2005 | Sun et al. ...................... 257/295 |
| 2005/0106810 | A1 * | 5/2005 | Pakala et al. ................. 438/257 |
| 2005/0174702 | A1 | 8/2005 | Gill |
| 2005/0189574 | A1 | 9/2005 | Nguyen et al. |
| 2006/0291108 | A1 * | 12/2006 | Sbiaa et al. .............. 360/324.12 |
| 2008/0112093 | A1 * | 5/2008 | Sato et al. ................. 360/324.2 |
| 2008/0230819 | A1 * | 9/2008 | Nguyen et al. ............... 257/295 |

OTHER PUBLICATIONS

Albert, et al., "Polarized Current Switching of a CO Thin Film Nanomagnet", American Institute of Physics, 77(23):3809-11 (2000).

Berger, "Emission of spin waves by a magnetic multilayer traversed by a current", Physical Review B, 54(13)9953-58 (1996).

Katine, et al., "Current-Driven Magnetization Reversal and Spin-Wave Excitations in Co/Cu/Co Pillars", Physical Review Letters, 84(14):3149-52 (2000).

Nishimura, et al., "Magnetic tunnel junction device with perpendicular magnetization films for high-density magnetic random access memory", J. of Applied Physics, 90(8):5246-49 (2002).

Slonczewski, Conductance and exchange coupling of two ferromagnets separated by a tunneling barrier, Physical Review B, 39(10):6995-7002 (1989).

Slonczewski, "Current-driven excitation of magnetic multilayers", J. of Magnetism and Magnetic Materials, 159:L1-L7 (1996).

Slonczewski, "Theory and Application of Exchange-Driven Switching", IEEE, pp. CE-02 (2000).

PCT International Search Report and Written Opinion of the ISA, application No. PCT/US08/64794.

PCT International Search Report and Written Opinion of the ISA, application No. PCT/US08/66369.

PCT International Search Report and Written Opinion of the ISA, application No. PCT/US10/47941.

PCT International Search Report and Written Opinion of the ISA, application No. PCT/US10/59184.

Office Action issued Apr. 2008 for U.S. Appl. No. 11/239,939.

Office Action issued Sep. 2008 for U.S. Appl. No. 11/239,939.

Office Action issued Jan. 2010 for U.S. Appl. No. 12/133,671.

Office Action issued Apr. 2009 for U.S. Appl. No. 12/133,671.

Office Action issued Mar. 2011 for U.S. Appl. No. 12/638,902.

Alam, et al., "On-Chip Clocking for Nanomagnet Logic Devices", IEEE Transactions on Nanotechnology (2009).

Varga, et al., "Experimental Demonstration of Non-Majority, Nanomagnet Logic Gates" (2009).

Varga, et al., "Programmable Nanomagnetic-Logic Majority Gate" (2010).

Extended European Search Report, Application No. 11195649.6, issued Mar. 26, 2012.

Fromter, et al., "Imaging the Cone State of the Spin Reorientation Transition", Physical Review Letters, 100:207202-1-4 (2008).

Stillrich, et al., "Magnetic anisotropy and the cone state in Co/Pt multiplayer films", J. of Applied Physics, 105:07C308 (2009).

* cited by examiner

METHOD AND SYSTEM FOR PROVIDING MAGNETIC LAYERS HAVING INSERTION LAYERS FOR USE IN SPIN TRANSFER TORQUE MEMORIES

CROSS-REFERENCE TO RELATED APPLICATIONS

This application claims the benefit of provisional Patent Application Ser. No. 61/429,041, filed Dec. 31, 2010, assigned to the assignee of the present application, and incorporated herein by reference.

GOVERNMENT RIGHTS

This invention was made with U.S. Government support under Grant/Contract No. HR0011-09-C-0023 awarded by DARPA. The U.S. Government retains certain rights in this invention.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-RAM). STT-RAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

Figure 1:
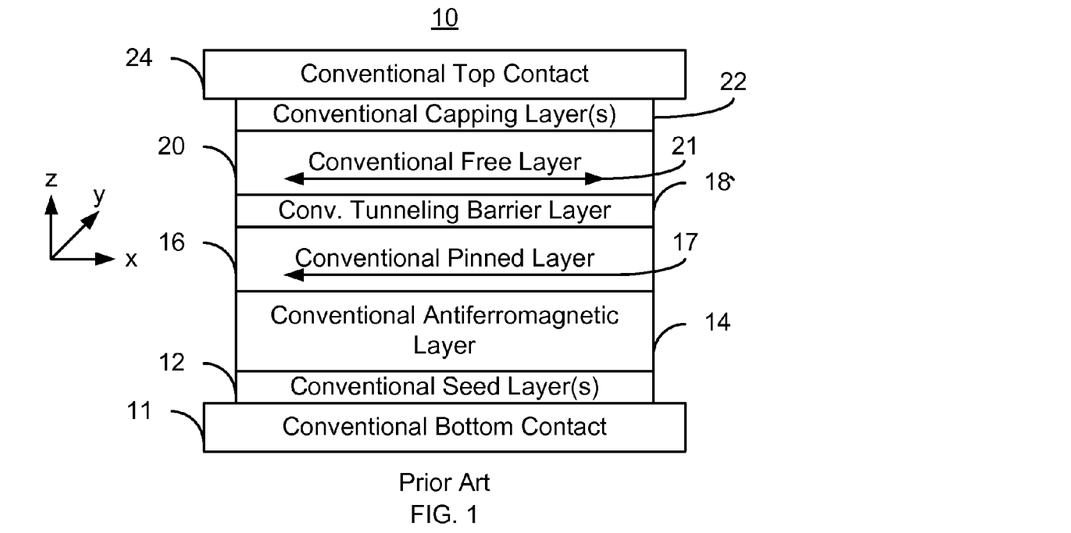
FIG. 1 depicts a conventional magnetic junction.

For example, FIG. 1 depicts a conventional magnetic tunneling junction (MTJ) 10 as it may be used in a conventional STT-RAM. The conventional MTJ 10 typically resides on a bottom contact 11, uses conventional seed layer(s) 12 and includes a conventional antiferromagnetic (AFM) layer 14, a conventional pinned layer 16, a conventional tunneling barrier layer 18, a conventional free layer 20, and a conventional capping layer 22. Also shown is top contact 24.

Conventional contacts 11 and 24 are used in driving the current in a current-perpendicular-to-plane (CPP) direction, or along the z-axis as shown in FIG. 1. The conventional seed layer(s) 12 are typically utilized to aid in the growth of subsequent layers, such as the AFM layer 14, having a desired crystal structure. The conventional tunneling barrier layer 18 is nonmagnetic and is, for example, a thin insulator such as MgO.

The conventional pinned layer 16 and the conventional free layer 20 are magnetic. The magnetization 17 of the conventional pinned layer 16 is fixed, or pinned, in a particular direction, typically by an exchange-bias interaction with the AFM layer 14. Although depicted as a simple (single) layer, the conventional pinned layer 16 may include multiple layers. For example, the conventional pinned layer 16 may be a synthetic antiferromagnetic (SAF) layer including magnetic layers antiferromagnetically coupled through thin conductive layers, such as Ru. In such a SAF, multiple magnetic layers interleaved with a thin layer of Ru may be used. In another embodiment, the coupling across the Ru layers can be ferromagnetic. Further, other versions of the conventional MTJ 10 might include an additional pinned layer (not shown) separated from the free layer 20 by an additional nonmagnetic barrier or conductive layer (not shown).

The conventional free layer 20 has a changeable magnetization 21. Although depicted as a simple layer, the conventional free layer 20 may also include multiple layers. For example, the conventional free layer 20 may be a synthetic layer including magnetic layers antiferromagnetically or ferromagnetically coupled through thin conductive layers, such as Ru. Although shown as in-plane, the magnetization 21 of the conventional free layer 20 may have a perpendicular anisotropy. Thus, the pinned layer 16 and free layer 20 may have their magnetizations 17 and 21, respectively oriented perpendicular to the plane of the layers.

To switch the magnetization 21 of the conventional free layer 20, a current is driven perpendicular to plane (in the z-direction). When a sufficient current is driven from the top contact 24 to the bottom contact 11, the magnetization 21 of the conventional free layer 20 may switch to be parallel to the magnetization 17 of the conventional pinned layer 16. When a sufficient current is driven from the bottom contact 11 to the top contact 24, the magnetization 21 of the free layer may switch to be antiparallel to that of the pinned layer 16. The differences in magnetic configurations correspond to different magnetoresistances and thus different logical states (e.g. a logical "0" and a logical "1") of the conventional MTJ 10.

When used in STT-RAM applications, the free layer 21 of the conventional MTJ 10 is desired to be switched at a relatively low current. The critical switching current ($I_{c0}$) is the lowest current at which the infinitesimal precession of free layer magnetization 21 around the equilibrium orientation becomes unstable. For example, $I_{c0}$ may be desired to be on the order of a few mA or less. In addition, a short current pulse is desired to be used in programming the conventional magnetic element 10 at higher data rates. For example, current pulses on the order of 20-30 ns or less are desired.

Figure 2:
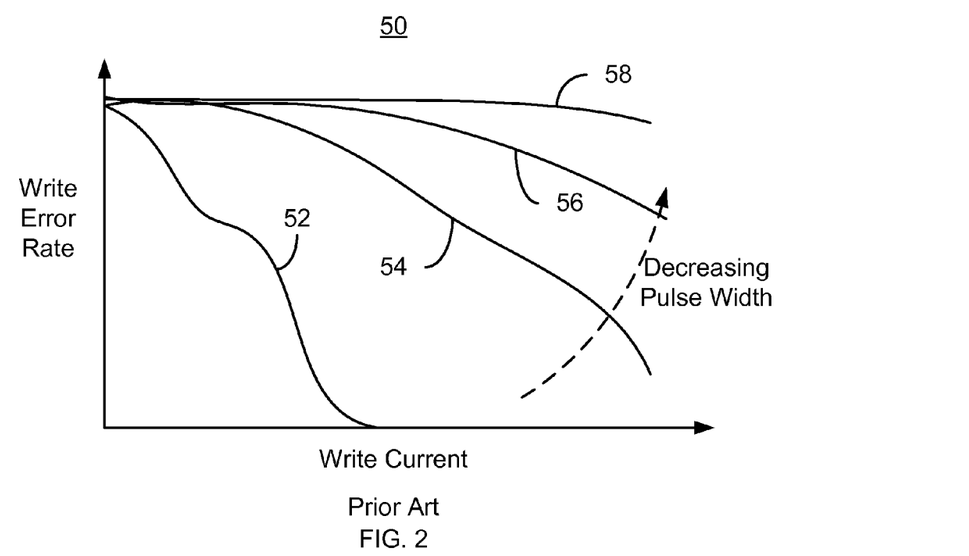
FIG. 2 is a graph depicting trends in write current versus write error rate.

Although the conventional MTJ 10 may be written using spin transfer and used in an STT-RAM, there are drawbacks. For example, the write error rates may be higher than desired for memories having an acceptable $I_{c0}$ and pulse width. The write error rate (WER) is the probability that a cell (i.e. the magnetization 21 of free layer 20 of the conventional magnetic junction) is not switched when subjected to a current that is at least equal to the typical switching current. The WER is desired to be $10^{-9}$ or less. However, the conventional free layer 20 typically has a WER greatly in excess of this value. In addition, it has been determined that the WER may be challenging to improve for shorter write current pulses. For example, FIG. 2 is a graph 50 depicts trends in WERs for pulses of different widths. Note that actual data are not plotted in the graph 50. Instead, the graph 50 is meant to indicate trends. The pulse width, from longest to shortest, is for curves 52, 54, 56, and 58. As can be seen in the graph 50, for higher pulse widths, the WER versus write current has a higher slope. Thus, application of a higher write current for the same pulse width may bring about a significant reduction in the WER. However, as the pulse widths shorten in curves 54, 56, and 58, the slope of the curves 54, 56, and 58 decreases. For a decreasing pulse width, an increase in current is less likely to bring about a reduction in the WER. Consequently, memories employing the conventional MTJ 10 may have unacceptably high WER that may not be cured by an increase in write current.

Various conventional solutions have been proposed to improve characteristics such as the WER. For example, magnetic field assisted switching and/or a magnetic junction having a complex structure may be used. However, the ability of such conventional schemes to reduce the WER while preserving other characteristics is limited. For example, scalability, energy consumption, and/or thermal stability may be adversely affected by such conventional methods.

In addition to the WER, other issues may exist for the conventional MTJ 10. For conventional MTJs 10 having the magnetizations 17 and 21 oriented perpendicular, the magnetoresistance may be lower than a conventional MTJ 10 having its magnetization in-plane. As a result, the signal from the conventional MTJ 10 may be lower than desired. Such perpendicular conventional MTJs 10 also exhibit high damping. As such, switching performance is adversely affected. Thus, performance of a memory using the conventional MTJ 10 is still desired to be improved.

Accordingly, what is needed is a method and system that may improve the performance of the spin transfer torque based memories. The method and system described herein address such a need.

BRIEF SUMMARY OF THE INVENTION

A method and system for providing a magnetic junction usable in a magnetic device are described. The magnetic junction includes a pinned layer, a nonmagnetic spacer layer, and a free layer. The nonmagnetic spacer layer is between the pinned layer and the free layer. The magnetic junction is configured such that the free layer is switchable between a plurality of stable magnetic states when a write current is passed through the magnetic junction. At least one of the pinned layer and the free layer includes a magnetic substructure. The magnetic substructure includes at least two magnetic layers interleaved with at least one insertion layer. Each insertion layer includes at least one of Cr, Ta, Ti, W, Ru, V, Cu, Mg, aluminum oxide, and MgO. The magnetic layers are exchange coupled.

DETAILED DESCRIPTION OF THE INVENTION

The exemplary embodiments relate to magnetic junctions usable in magnetic devices, such as magnetic memories, and the devices using such magnetic junctions. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

Methods and systems for providing a magnetic junction as well as a magnetic memory utilizing the magnetic junction are described. The exemplary embodiments provide methods and systems for providing a magnetic junction usable in a magnetic device. The magnetic junction includes a pinned layer, a nonmagnetic spacer layer, and a free layer. The nonmagnetic spacer layer is between the pinned layer and the free layer. The magnetic junction is configured such that the free layer is switchable between a plurality of stable magnetic states when a write current is passed through the magnetic junction. At least one of the pinned layer and the free layer includes a magnetic substructure. The magnetic substructure includes at least two magnetic layers interleaved with at least one insertion layer. Each insertion layer includes at least one of Cr, Ta, Ti, W, Ru, V, Cu, Mg, aluminum oxide, and MgO. The magnetic layers are exchange coupled.

The exemplary embodiments are described in the context of particular magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomenon. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single magnetic junctions and substructures. However, one of ordinary skill in the art will readily recognize that the method and system are consistent with the use of magnetic memories having multiple magnetic junctions and using multiple substructures. Further, as used herein, "in-plane" is substantially within or parallel to the plane of one or more of the layers of a magnetic junction. Conversely, "perpendicular" corresponds to a direction that is substantially perpendicular to one or more of the layers of the magnetic junction.

Figure 3:
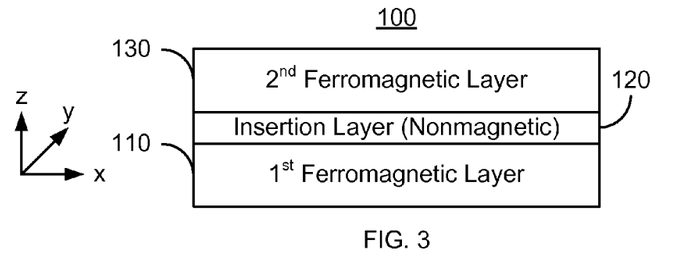
FIG. 3 depicts an exemplary embodiment of a magnetic substructure.

FIG. 3 depicts an exemplary embodiment of a magnetic substructure 100 usable in a magnetic device, for example a magnetic tunneling junction (MTJ), spin valve, or ballistic magnetoresistance structure, or some combination thereof. The magnetic device in which the magnetic substructure 100 is used may be used in a variety of applications. For example, the magnetic device, and thus the magnetic substructure, may be used in a magnetic memory such as an STT-RAM. For clarity, FIG. 3 is not to scale. The magnetic substructure 100 includes a first ferromagnetic layer 110, an insertion layer 120, and a second ferromagnetic layer 130. Although layers 110, 120, and 130 are shown with a particular orientation, this orientation may vary in other embodiments. For example, the ferromagnetic layer 110 may be at the top (furthest from a substrate that is not shown) of the magnetic substructure 100.

The ferromagnetic layers 110 and 130 may include one or more of Ni, Fe, and Co, particularly in an alloy form. In some embodiments, the ferromagnetic layers 110 and 130 include CoFe. In some such embodiments, the ferromagnetic layers 110 and 130 consist of CoFeB. One or both of the ferromagnetic layers 110 and 130 are configured to be stable at room temperature. For example, the magnetic anisotropy energy for the ferromagnetic layers 110 and/or 130 may be at least at least sixty times $k_bT$. In some embodiments, the magnetic anisotropy energies for the ferromagnetic layers 110 and/or 130 are at least eighty times $k_bT$ at room temperature (approximately thirty degrees centigrade). In addition, the layers 110 and 130 are magnetically coupled. In some such embodiments, the layers 110 and 130 are exchange coupled. In some embodiments, this exchange coupling promotes substantially parallel orientations of the magnetizations (not shown in FIG. 3) of the ferromagnetic layers 110 and 130. In other embodiments, the exchange coupling may promote substantially antiparallel or other relative orientation of the magnetizations of the layers 110 and 130. In some of these embodiments, the layer 110 and/or 130 may have a high perpendicular anisotropy. Stated differently, the layer 110 and/or 130 may be weakly in-plane. For example, in some such embodiments, the perpendicular anisotropy energy of the layer 110 and/or 130 may be close to, but less than, the out-of-plane demagnetization energy (approaching $4\pi M_s$ for large cells and less than $4\pi M_s$ for smaller cells due to decreased demagnetization field at the edges). For example, the perpendicular anisotropy energy may be at least forty percent of the out-of-plane demagnetization energy. In some such embodiments, the perpendicular anisotropy energy may be not more than ninety percent of the demagnetization energy. In other embodiments, the magnetizations of the layers 110 and 130 are both perpendicular. In still other embodiments, one or both of the magnetizations of the layers 110 and 130 have components in plane and perpendicular to plane.

The insertion layer 120 is a nonmagnetic layer residing between the ferromagnetic layers 110 and 130. The insertion layer 120 may be conductive. For example, the insertion layer may include materials such as at least one of Cr, Ta, Ti, W, and Ru. In some such embodiments, the insertion layer 120 consists of one of Cr, Ta, Ti, W, and Ru. In other embodiments, the insertion layer 120 may be an insulator such as aluminum oxide and/or MgO. The insertion layer 120 may be used to tailor the magnetic coupling between the layers 110 and 130. The insertion layer 120 may also be used to improve the tunneling magnetoresistance (TMR) of a magnetic tunneling junction, employing the magnetic substructure 100. The coupling between the ferromagnetic layers of the magnetic substructure 100 and the TMR of the magnetic tunneling junction employing the magnetic substructure 100 may be tailored by changing the composition and thickness of the insertion layer 120 as well as the thicknesses and compositions of the ferromagnetic layers 110 and 130.

The properties of the magnetic substructure 100 may be tailored using a combination of the insertion layer 120 and the ferromagnetic layers 110 and 130. As a result, the properties of a magnetic device in which the magnetic substructure 100 is used may also be configured as desired. For example, the TMR of the magnetic device in which the magnetic substructure 100 is used may be enhanced due to improved crystallization of the free layer and lattice match with the tunneling junction, especially for a tunneling junction with two barriers. The switching characteristics, such as the WER and data rate, may be enhanced in a magnetic device in which the magnetic substructure 100 is used.

Figure 4:
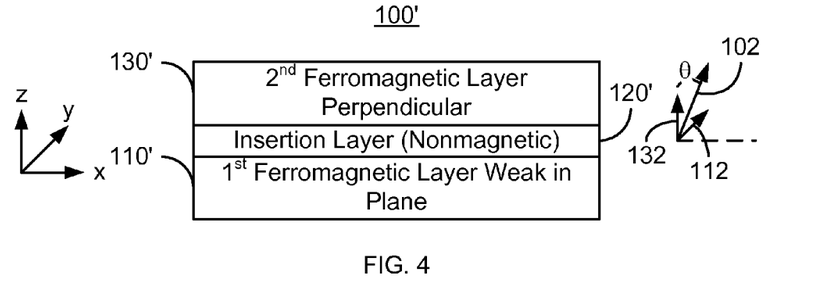
FIG. 4 depicts another exemplary embodiment of a magnetic substructure.

FIG. 4 depicts an exemplary embodiment of a magnetic substructure 100' usable in a magnetic device, for example a MTJ, spin valve, or ballistic magnetoresistance structure, or some combination thereof. The magnetic device in which the magnetic substructure 100' is used may be used in a variety of applications. For example, the magnetic device, and thus the magnetic substructure, may be used in a magnetic memory such as an STT-RAM. For clarity, FIG. 4 is not to scale. The magnetic substructure 100' is analogous to the magnetic substructure 100. Consequently, analogous components are labeled similarly. The magnetic substructure 100' thus includes a first ferromagnetic layer 110', an insertion layer 120', and a second ferromagnetic layer 130' that are analogous to the first ferromagnetic layer 110, the insertion layer 120, and the second ferromagnetic layer 130. Although layers 110', 120', and 130' are shown with a particular orientation, this orientation may vary in other embodiments. For example, the ferromagnetic layer 110' may be at the top (furthest from a substrate that is not shown) of the magnetic substructure 100'.

The magnetic substructure 100' is configured such that the ferromagnetic layer 110' has a weak in-plane anisotropy. Thus, the perpendicular anisotropy energy of the layer 110' may be close to, but less than, the out-of-plane demagnetization energy. For example, the perpendicular anisotropy energy may be at least forty percent of the out-of-plane demagnetization energy for the layer 110'. In some such embodiments, the perpendicular anisotropy energy may be not more than ninety percent of the demagnetization energy. Thus, without the interaction with the layer 130', the magnetization of the ferromagnetic layer 110 is in plane. In contrast, the layer 130' has a high perpendicular anisotropy. Thus, the perpendicular anisotropy energy is greater than the out-of-plane demagnetization energy. In some embodiments, the perpendicular anisotropy energy is significantly greater than the out-of-plane demagnetization energy. For example, in some embodiments, the perpendicular anisotropy energy may be two through four kilooersted (or more) greater than the out-of-plane demagnetization energy.

The ferromagnetic layers 110' and 130' may include one or more of Ni, Fe, and Co, particularly in an alloy form. In some embodiments, the ferromagnetic layers 110' and 130' include CoFe in some form, such as CoFeB. For example, in some embodiments, the ferromagnetic layers 110' and/or 130' could include alloys such CoFeB, CoPd, CoPt, FePt, as simple layers and/or mulitilayers such as Co/Pd, Co/Pt, Fe/Pt, Co/Ru. At least one of the ferromagnetic layers 110' and 130' is configured to be stable at room temperature. For example, the magnetic anisotropy energy for one or both of the ferromagnetic layers 110' and/or 130' may be at least at least sixty times $k_bT$. In some embodiments, the magnetic anisotropy energies for one or both of the ferromagnetic layers 110' and/or 130' are at least eighty times $k_bT$ at room temperature (approximately thirty degrees centigrade).

The ferromagnetic layers 110' and 130' are magnetically coupled. In some such embodiments, the layers 110' and 130' are exchange coupled. The net result of the magnetizations are also shown in FIG. 4. The magnetization 112 of the ferromagnetic layer 110', the magnetization 132 of the ferromagnetic layer 132 and the net magnetization 102 of the structure 100' are shown. As can be seen in FIG. 4, the magnetization 112 is not in-plane. This is because of the magnetic coupling between the layers 110' and 130'. The high perpendicular anisotropy energy layer 130' is magnetically coupled with the weakly in-plane layer 110', causing the magnetization 112 of the layer 110' to be out-of-plane. Thus, the magnetization 112 has components in-plane and perpendicular-to-plane. As a result, the net moment of the magnetic structure 100' has components in plane and perpendicular-to-plane. Because of the exchange interaction between the layers 110' and 130', the magnetization 102 of the magnetic substructure 100' is at an angle θ from the z-axis (normal to the plane of the magnetic substructure 100'). The net result is that the magnetization 102 of the magnetic substructure 100' is stable in an angle from the z-axis. Consequently, improved switching characteristics, thermal stability, and scalability may be achieved.

This initial nonzero angle allows the magnetization of the magnetic substructure 100' to be more easily switched by a spin transfer torque. For example, the magnetic substructure 100' may be used in an MTJ. This characteristic corresponds to a lower write error rate for such a magnetic element. The lower WER may be achieved even at low pulse widths (high data rates). In particular, the slope of the write error rate versus write current may remain sufficiently large even for pulse widths of less than ten ns. In some embodiments, an acceptable write error rate of $10^{-9}$ or less may be achieved for pulse widths of 10-30 ns or less. Thus, instead of assisting switching using a mechanism such as an external field, the physical cause of the high error rates is addressed. Consequently, when used in a magnetic element, such as an MTJ, the magnetic substructure 100' may have an improved write error rate even for lower pulse widths.

Figure 5:
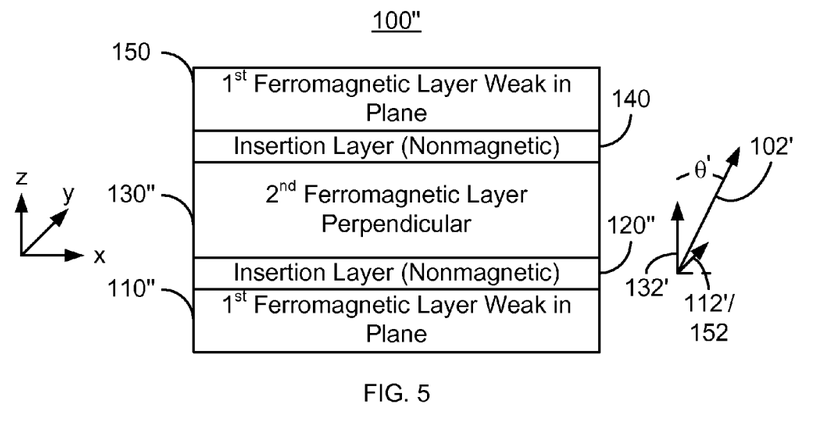
FIG. 5 depicts another exemplary embodiment of a magnetic substructure.

FIG. 5 depicts an exemplary embodiment of a magnetic substructure 100" usable in a magnetic device, for example a MTJ, spin valve, or ballistic magnetoresistance structure, or some combination thereof. The magnetic device in which the magnetic substructure 100" is used may be used in a variety of applications. For example, the magnetic device, and thus the magnetic substructure, may be used in a magnetic memory such as an STT-RAM. For clarity, FIG. 5 is not to scale. The magnetic substructure 100" is analogous to the magnetic substructures 100 and 100'. Consequently, analogous components are labeled similarly. The magnetic substructure 100" thus includes a first ferromagnetic layer 110", an insertion layer 120", and a second ferromagnetic layer 130" that are analogous to the first ferromagnetic layer 110/110', the insertion layer 120/120', and the second ferromagnetic layer 130/130'. Although layers 110", 120", and 130" are shown with a particular orientation, this orientation may vary in other embodiments. For example, the ferromagnetic layer 110" may be at the top (furthest from a substrate that is not shown) of the magnetic substructure 100".

The magnetic substructure 100" also includes an additional insertion layer 140 and another ferromagnetic layer 150. In the embodiment shown, the layers 110" and 150 have a weak in-plane anisotropy. Thus, without more, the magnetizations of the ferromagnetic layers 110" and 150 are in plane. The layer 130" is strongly perpendicular. In some embodiments, the layer 130" is thicker than the layers 110" and 150. For example, the layer 130" may have a thickness equal to the sum of the thicknesses of the layers 110" and 150. The layers 110", 130" and 150 are magnetically coupled. In some embodiments, the layers 110", 130", and 150 are exchange coupled. Further, the layer 130" is magnetically stable at room temperature. In some embodiments, the magnetic anisotropy energy for the ferromagnetic layer 130" are at least sixty times $k_bT$ at room temperature. In some such embodiments, the magnetic anisotropy energies for the ferromagnetic layer 130" is at least eighty times $k_bT$ at room temperature.

FIG. 5 also depicts the magnetizations 112', 132' and 152 of the layers 110", 130", and 150, respectively. Further, the net magnetization 102' of the magnetic substructure 100" is shown. The magnetizations 112' and 152 are shown as being the same. However, in other embodiments, the magnetizations 112' and 152 may differ. As can be seen in FIG. 5, the magnetizations 112' and 152 are not in-plane. This is because of the magnetic coupling between the layers 110"/150 and 130". As a result, the net moment 102' of the magnetic structure 100" has components in plane and perpendicular-to-plane. Because of the exchange interaction between the layers 110"/150 and 130", the magnetization 102' of the magnetic substructure 100' is at an angle θ' from the z-axis (normal to the plane of the magnetic substructure 100"). The net result is that the magnetization 102 of the magnetic substructure 100" is stable at an angle from the z-axis. Consequently, improved switching characteristics, thermal stability, and scalability may be achieved.

The magnetic substructure 100" shares the benefits of the magnetic substructure 100'. In particular, when used in a magnetic element, such as an MTJ, the MTJ may have a lower WER. Consequently, when used in a magnetic element, such as an MTJ, the magnetic substructure 100" may have an improved write error rate even for lower pulse widths. At the same time, the magnetic substructure 100" may be magnetically stable.

Figure 6:
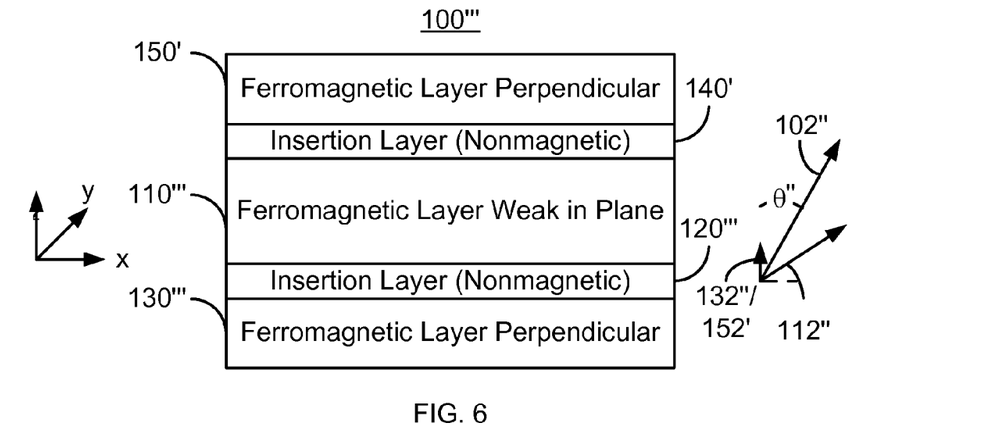
FIG. 6 depicts another exemplary embodiment of a magnetic substructure.

FIG. 6 depicts an exemplary embodiment of a magnetic substructure 100''' usable in a magnetic device, for example a MTJ, spin valve, or ballistic magnetoresistance structure, or some combination thereof. The magnetic device in which the magnetic substructure 100''' is used may be used in a variety of applications. For example, the magnetic device, and thus the magnetic substructure, may be used in a magnetic memory such as an STT-RAM. For clarity, FIG. 6 is not to scale. The magnetic substructure 100''' is analogous to the magnetic substructures 100, 100', and 100". Consequently, analogous components are labeled similarly. The magnetic substructure 100''' thus includes a first ferromagnetic layer 110''', an insertion layer 120''', a second ferromagnetic layer 130''', an additional insertion layer 140' and an additional ferromagnetic layer 150' that are analogous to the first ferromagnetic layer 110/110'/110", the insertion layer 120/120'/120", the second ferromagnetic layer 130/130'/130", the additional insertion layer 140, and the additional ferromagnetic layer 150. Although layers 110", 120", 130", 140', and 150' are shown with a particular orientation, this orientation may vary in other embodiments. For example, the ferromagnetic layer 130''' may be at the top (furthest from a substrate that is not shown) of the magnetic substructure 100'''.

In the magnetic substructure 100''', the weakly in-plane layer 110''' is between the perpendicular layers 130" and 150'. Without more, the magnetization of the ferromagnetic layer 110" is in plane. In some embodiments, the layer 110''' is thicker than the layers 130''' and 150'. For example, the layer 110''' may have a thickness equal to the sum of the thicknesses of the layers 130''' and 150'. The layers 110''', 130''' and 150' are magnetically coupled. In some embodiments, the layers 110''', 130''', and 150' are exchange coupled. Further, the layers 130''' and 150' are magnetically stable at room temperature. In some embodiments, the magnetic anisotropy energies for the ferromagnetic layers 130''', and/or 150' are at least sixty times $k_bT$ at room temperature. In other embodiments, the magnetic anisotropy energies for the ferromagnetic layers 110''', 130''', and/or 150' are at least eighty times $k_bT$ at room temperature.

FIG. 6 also depicts the magnetizations 112", 132" and 152' of the layers 110''', 130''', and 150', respectively. Further, the net magnetization 102" of the magnetic substructure 100''' is shown. The magnetizations 132" and 152' are shown as being the same. However, in other embodiments, the magnetizations 132" and 152' may differ. As can be seen in FIG. 6, the magnetization 112" is not in-plane. This is because of the magnetic coupling between the layers 110''' and 130'''/150'. As a result, the net moment 102" of the magnetic structure 100''' has components in plane and perpendicular-to-plane. Because of the exchange interaction between the layers 110''' and 130'''/150', the magnetization 102" of the magnetic substructure 100''' is at an angle θ" from the z-axis (normal to the plane of the magnetic substructure 100'''). The net result is that the magnetization 102" of the magnetic substructure 100''' is stable at an angle from the z-axis. Consequently, improved switching characteristics, thermal stability, and scalability may be achieved.

The magnetic substructure 100''' shares the benefits of the magnetic substructure 100'. In particular, when used in a magnetic element, such as an MTJ, the MTJ may have a lower WER. Consequently, when used in a magnetic element, such as an MTJ, the magnetic substructure 100''' may have an improved write error rate even for lower pulse widths. At the same time, the magnetic substructure 100''' may be magnetically stable.

Figure 7:
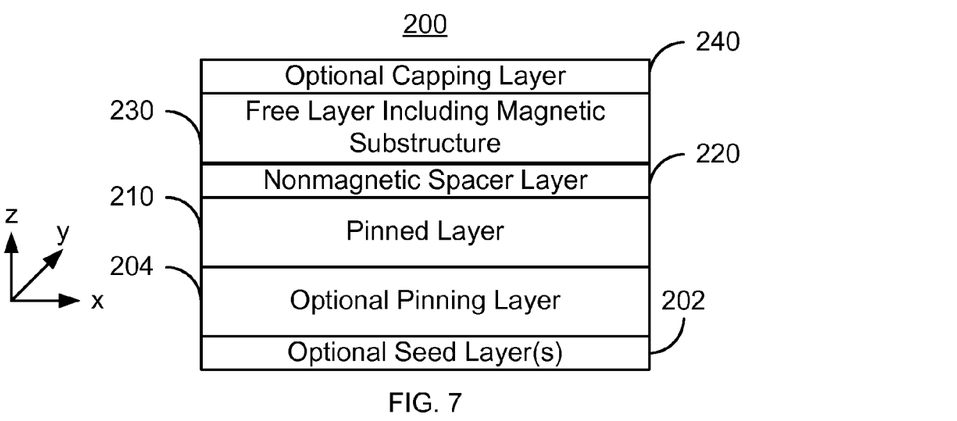
FIG. 7 depicts an exemplary embodiment of a magnetic junction including magnetic substructure.

FIG. 7 depicts an exemplary embodiment of a magnetic junction 200 including magnetic substructure. For clarity, FIG. 7 is not to scale. The magnetic junction 200 includes a pinned layer 210, a nonmagnetic spacer layer 220, and a free layer 230. Although layers 210, 220, and 230 are shown with a particular orientation, this orientation may vary in other embodiments. For example, the pinned layer 210 may be closer to the top (furthest from a substrate that is not shown) of the magnetic junction 200. Also shown are optional seed layer 202, optional pinning layer 204, and optional capping layer 240. The optional pinning layer 204 may be used to fix the magnetization (not shown) of the pinned layer 210. In some embodiments, the optional pinning layer 204 may be an AFM layer or multilayer that pins the magnetization (not shown) of the pinned layer 210 by an exchange-bias interaction. However, in other embodiments, the optional pinning layer 204 may be omitted or another structure may be used. The magnetic junction 200 is also configured to allow the free layer 230 to be switched between stable magnetic states when a write current is passed through the magnetic junction 200. Thus, the free layer 230 is switchable utilizing spin transfer torque.

Although depicted as a simple layer, the pinned layer 210 may include multiple layers. For example, the pinned layer 210 may be a SAF including magnetic layers antiferromagnetically or ferromagnetically coupled through thin layers, such as Ru. In such a SAF, multiple magnetic layers interleaved with thin layer(s) of Ru or other material may be used. The pinned layer 210 may also be another multilayer. Although a magnetization is not depicted in FIG. 7, the pinned layer 210 may have a perpendicular anisotropy energy that exceeds the out-of-plane demagnetization energy. Thus, the pinned layer 210 may have its magnetic moment oriented perpendicular to plane. In other embodiments, the magnetic moment of the pinned layer 210 is in-plane. Other orientations of the magnetization of the pinned layer 210 are possible.

The spacer layer 220 is nonmagnetic. In some embodiments, the spacer layer 220 is an insulator, for example a tunneling barrier. In such embodiments, the spacer layer 220 may include crystalline MgO, which may enhance the TMR of the magnetic junction. In other embodiments, the spacer layer may be a conductor, such as Cu. In alternate embodiments, the spacer layer 220 might have another structure, for example a granular layer including conductive channels in an insulating matrix.

The free layer 230 includes the magnetic substructure 100, 100', 100", and/or 100'''. In some embodiments, the free layer 230 is composed of the magnetic substructure 100, 100', 100", and/or 100'''.

Because the magnetic substructure 100, 100', 100", and/or 100''' is used in the free layer 230, the magnetic junction 200 may share the benefits of the magnetic substructure 100, 100', 100", and/or 100'''. In particular, the magnetic junction 200 may be thermally stable. Further, the net magnetic magnetization of the free layer 230 may be at an angle from the z axis that is less than ninety degrees, but greater than zero degrees. Stated differently, the net magnetization of the free layer 230 is canted from the z-axis. Thus, the free layer 230 may be easier to switch using spin transfer torque. Further, the WER of the magnetic junction may be reduced.

Figure 8:
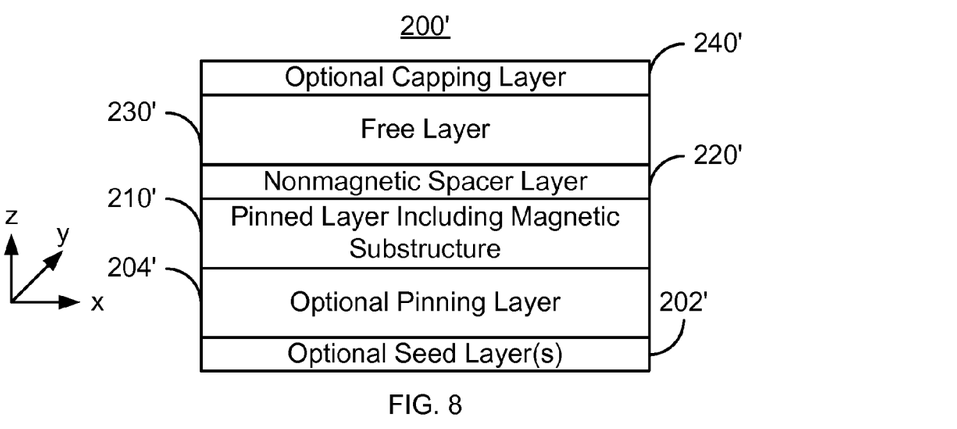
FIG. 8 depicts another exemplary embodiment of a magnetic junction including magnetic substructure.

FIG. 8 depicts an exemplary embodiment of a magnetic junction 200' including magnetic substructure. For clarity, FIG. 8 is not to scale. The magnetic junction 200' is analogous to the magnetic junction 200. Thus, analogous layers are labeled similarly. The magnetic junction 200' includes a pinned layer 210', a nonmagnetic spacer layer 220', and a free layer 230' analogous to the layers 210, 220, and 230, respectively. Although layers 210', 220', and 230' are shown with a particular orientation, this orientation may vary in other embodiments. For example, the pinned layer 210' may be closer to the top (furthest from a substrate that is not shown) of the magnetic junction 200'. Also shown are optional seed layer 202', optional pinning layer 204' and optional capping layer 240' analogous to the optional seed layer 202, optional pinning layer 204, and optional capping layer 240. The magnetic junction 200' is also configured to allow the free layer 230' to be switched between stable magnetic states when a write current is passed through the magnetic junction 200'. Thus, the free layer 230' is switchable utilizing spin transfer torque.

The spacer layer 220' is nonmagnetic. In some embodiments, the spacer layer 220' is an insulator, for example a tunneling barrier. In such embodiments, the spacer layer 220' may include crystalline MgO, which may enhance the tunneling magnetoresistance (TMR) of the magnetic junction. In other embodiments, the spacer layer may be a conductor, such as Cu. In alternate embodiments, the spacer layer 220' might have another structure, for example a granular layer including conductive channels in an insulating matrix.

The free layer 230' may be a simple layer or may include multiple layers. For example, the free layer 230' may be a SAF including magnetic layers antiferromagnetically or ferromagnetically coupled through thin layers, such as Ru. In such a SAF, multiple magnetic layers interleaved with thin layer(s) of Ru or other material may be used. The free layer 230' may also be another multilayer. Although a magnetization is not depicted in FIG. 8, the free layer may have a perpendicular anisotropy energy that exceeds the out-of-plane demagnetization energy.

The pinned layer 210' includes the magnetic substructure 100, 100', 100'', and/or 100'''. In some embodiments, the pinned layer 210' is composed of the magnetic substructure 100, 100', 100'', and/or 100'''.

Figure 9:
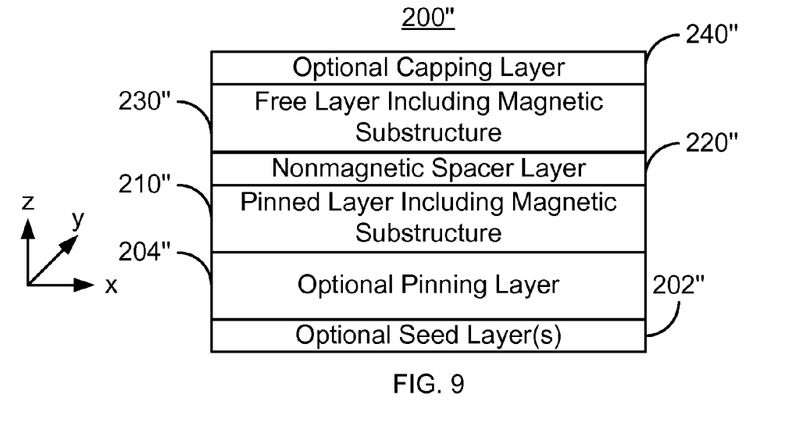
FIG. 9 depicts another exemplary embodiment of a magnetic junction including magnetic substructure.

FIG. 9 depicts an exemplary embodiment of a magnetic junction 200'' including magnetic substructure. For clarity, FIG. 9 is not to scale. The magnetic junction 200'' is analogous to the magnetic junctions 200 and 200'. Thus, analogous layers are labeled similarly. The magnetic junction 200'' includes a pinned layer 210'', a nonmagnetic spacer layer 220'', and a free layer 230'' analogous to the layers 210/210', 220/220', and 230/230', respectively. Although layers 210'', 220'', and 230'' are shown with a particular orientation, this orientation may vary in other embodiments. For example, the pinned layer 210'' may be closer to the top (furthest from a substrate that is not shown) of the magnetic junction 200''. Also shown are optional seed layer 202'', optional pinning layer 204'' and optional capping layer 240'' analogous to the optional seed layer 202/202', optional pinning layer 204/204', and optional capping layer 240/240'. The magnetic junction 200'' is also configured to allow the free layer 230'' to be switched between stable magnetic states when a write current is passed through the magnetic junction 200''. Thus, the free layer 230'' is switchable utilizing spin transfer torque.

The pinned layer 210'' includes the magnetic substructure 100, 100', 100'', and/or 100'''. In some embodiments, the pinned layer 210'' is composed of the magnetic substructure 100, 100', 100'', and/or 100'''.

The spacer layer 220'' is nonmagnetic. In some embodiments, the spacer layer 220'' is an insulator, for example a tunneling barrier. In such embodiments, the spacer layer 220'' may include crystalline MgO, which may enhance the TMR of the magnetic junction. In other embodiments, the spacer layer 220'' may be a conductor, such as Cu. In alternate embodiments, the spacer layer 220'' might have another structure, for example a granular layer including conductive channels in an insulating matrix.

The free layer 230'' includes the magnetic substructure 100, 100', 100'', and/or 100'''. In some embodiments, the free layer 230'' is composed of the magnetic substructure 100, 100', 100'', and/or 100'''.

Because the magnetic substructure 100, 100', 100'', and/or 100''' is used in the free layer 230'', the magnetic junction 200'' may share the benefits of the magnetic substructure 100, 100', 100'', and/or 100'''. In particular, the magnetic junction 200'' may be thermally stable. Further, the net magnetic magnetization of the free layer 230'' may be at an angle from the z axis that is less than ninety degrees, but greater than zero degrees. Stated differently, the net magnetization of the free layer 230' is canted from the z-axis. Thus, the free layer 230' may be easier to switch using spin transfer torque. Further, the WER of the magnetic junction may be reduced.

Figure 10:
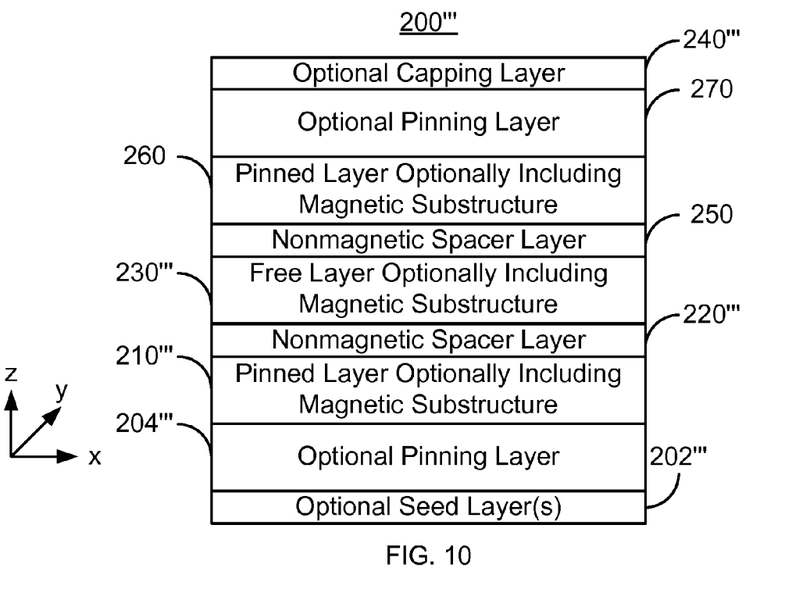
FIG. 10 depicts another exemplary embodiment of a magnetic junction including magnetic substructure.

FIG. 10 depicts an exemplary embodiment of a magnetic junction 200''' including magnetic substructure. For clarity, FIG. 10 is not to scale. The magnetic junction 200''' is analogous to the magnetic junctions 200, 200', and 200''. Thus, analogous layers are labeled similarly. The magnetic junction 200''' includes a pinned layer 210''', a nonmagnetic spacer layer 220''', and a free layer 230''' analogous to the layers 210/210'/210'', 220/220'/220'', and 230/230'/230'', respectively. The magnetic junction 200''' is also shown as including optional layers 202''', 204''', and 240''' analogous to layers 202/202'/202'', 204/204'/204'', and 240''', respectively. Also shown are additional nonmagnetic spacer layer 250, additional pinned layer 260, and additional optional pinning layer 270. The layers 250, 260, and 270 are analogous to layers 220/220'/220''/220''', 210/210'/210''/210''', and 204/204'/204''/204''', respectively. Thus, the magnetic junction 200''' is a dual magnetic junction. Although layers 210''', 220''', 230''', 250, and 260 are shown with a particular orientation, this orientation may vary in other embodiments. For example, the pinned layer 210''' may be closer to the top (furthest from a substrate that is not shown) of the magnetic junction 200'''. The magnetic junction 200''' is also configured to allow the free layer 230''' to be switched between stable magnetic states when a write current is passed through the magnetic junction 200'''. Thus, the free layer 230''' is switchable utilizing spin transfer torque.

The pinned layer 210''', the free layer 230''', and/or the pinned layer 260 includes the magnetic substructure 100, 100', 100'', and/or 100'''. In some embodiments, the pinned layer 210''' the free layer 230''', and/or the pinned layer 260 is composed of the magnetic substructure 100, 100', 100'', and/or 100'''.

Because the magnetic substructure 100, 100', 100'', and/or 100''' may be used in the free layer 230''', the magnetic junction 200''' may share the benefits of the magnetic substructure 100, 100', 100'', and/or 100'''. In particular, the magnetic junction 200''' may be thermally stable. Further, the net magnetization of the free layer 230''' may be at an angle from the z axis that is less than ninety degrees, but greater than zero degrees. Stated differently, the net magnetization of the free layer 230'' is canted from the z-axis. Thus, the free layer 230' may be easier to switch using spin transfer torque. Further, the WER of the magnetic junction may be reduced.

Figure 11:
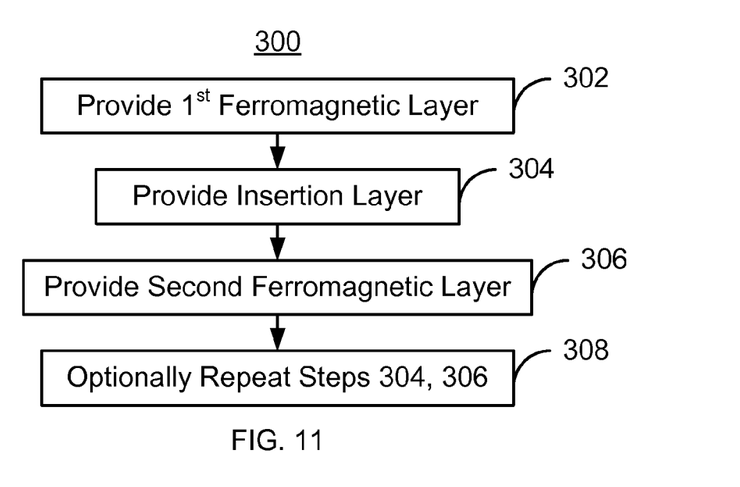
FIG. 11 depicts an exemplary embodiment of a method for providing a magnetic substructure.

FIG. 11 depicts an exemplary embodiment of a method 300 for fabricating magnetic substructure. For simplicity, some steps may be omitted or combined. The method 300 is described in the context of the magnetic substructure 100. However, the method 300 may be used on other magnetic substructure such as the substructure 100', 100'' and/or 100'''. Further, the method 300 may be incorporated into fabrication of magnetic memories. Thus the method 300 may be used in manufacturing a STT-RAM or other magnetic memory.

The ferromagnetic layer 110 is provided, via step 302. Step 302 may include depositing the desired materials at the desired thickness of the ferromagnetic layer 110. The insertion layer 120 is provided, via step 304. Step 304 may include depositing the desired nonmagnetic materials. In addition, the desired thickness of material may be deposited in step 304. The second ferromagnetic layer is provided, via step 306. The steps of providing the insertion layer and another ferromagnetic layer are optionally repeated, via step 308. Thus, the magnetic substructure having the desired number of ferromagnetic layers and insertion layers may be provided. Thus, the magnetic substructure 100, 100', 100", and/or 100'" is formed. Consequently, the benefits of the magnetic substructure may be achieved.

Figure 12:
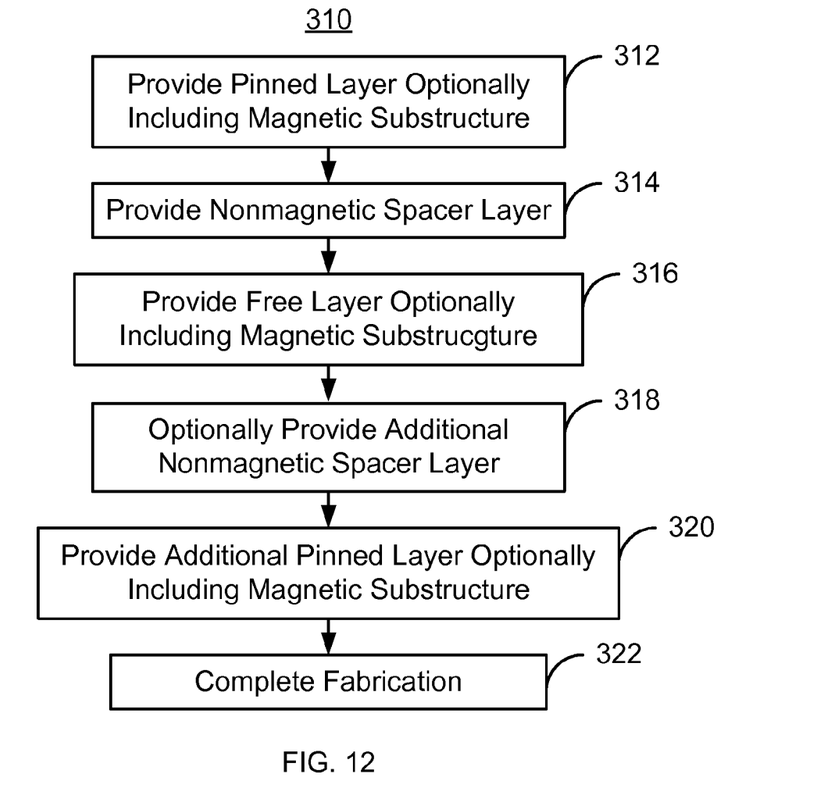
FIG. 12 an exemplary embodiment of a method for fabricating a magnetic junction including a magnetic substructure.

FIG. 12 depicts an exemplary embodiment of a method 310 for fabricating magnetic substructure. For simplicity, some steps may be omitted or combined. The method 310 is described in the context of the magnetic junction 200. However, the method 310 may be used on other magnetic junctions such as the junctions 200', 200" and/or 200'". Further, the method 310 may be incorporated into fabrication of magnetic memories. Thus the method 310 may be used in manufacturing a STT-RAM or other magnetic memory. The method 310 may commence after the seed layer(s) 202 and optional pinning layer 204 are provided.

The pinned layer 210 is provided, via step 312. Step 312 may include depositing the desired materials at the desired thickness of the pinned layer 210. Further, step 312 may include providing a SAF. In other embodiments, the magnetic substructure 100, 100', 100", and/or 100'" may be provided. The nonmagnetic layer 220 is provided, via step 314. Step 314 may include depositing the desired nonmagnetic materials, including but not limited to crystalline MgO. In addition, the desired thickness of material may be deposited in step 314.

The free layer 230 optionally including the magnetic substructure 100, 100', 100", and/or 100'" is provided, via step 316. An additional nonmagnetic spacer layer, such as layer 250 may be provided, via step 318. An additional pinned layer, such as the layer 260, may be optionally provided, via step 320. Fabrication may then be completed, via step 322. For example, the capping layer 240 may be provided. In other embodiments, optional additional pinning layer 270 may be provided. In some embodiments, in which the layers of the magnetic junction are deposited as a stack, then defined, step 322 may include defining the magnetic junction 200, performing anneals, or otherwise completing fabrication of the magnetic junction 200/200'. Further, if the magnetic junction 200/200' is incorporated into a memory, such as an STT-RAM, step 322 may include providing contacts, bias structures, and other portions of the memory. Consequently, the benefits of the magnetic junction may be achieved.

Figure 13:
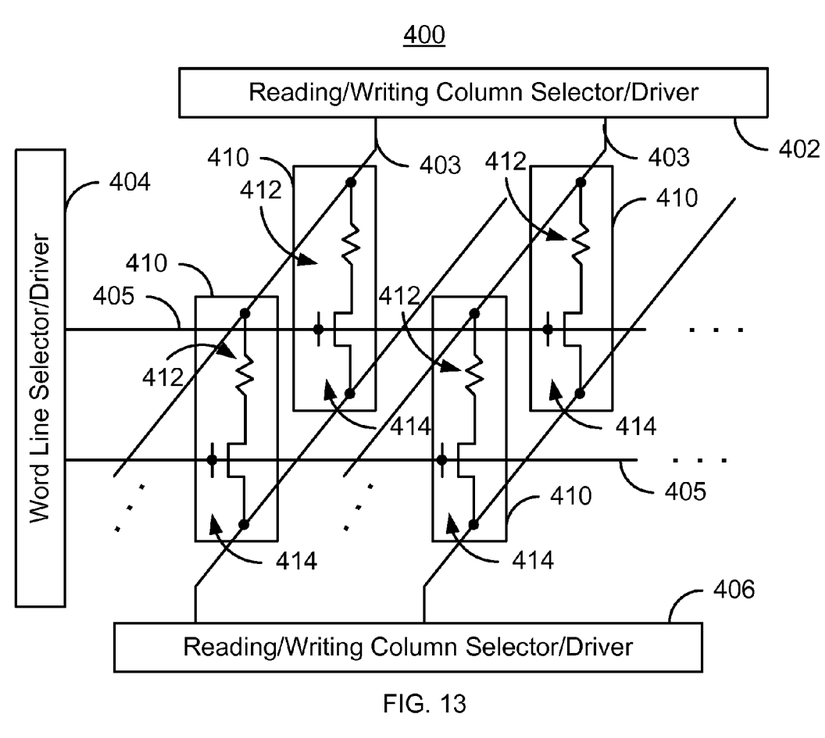
FIG. 13 depicts an exemplary embodiment of a memory utilizing magnetic junctions in the memory element(s) of the storage cell(s).

Further, the magnetic junctions 200, 200', 200", and/or 200'" may be used in a magnetic memory. FIG. 13 depicts an exemplary embodiment of one such memory 400. The magnetic memory 400 includes reading/writing column select drivers 402 and 406 as well as word line select driver 404. Note that other and/or different components may be provided. The storage region of the memory 400 includes magnetic storage cells 410. Each magnetic storage cell includes at least one magnetic junction 412 and at least one selection device 414. In some embodiments, the selection device 414 is a transistor. The magnetic junctions 412 may be one of the magnetic junctions 200, 200', 200", and/or 200'". Although one magnetic junction 412 is shown per cell 410, in other embodiments, another number of magnetic junctions 412 may be provided per cell. As such, the magnetic memory 400 may enjoy the benefits described above, such as lower soft error rate and a low critical switching current.

Various magnetic substructures 100, 100', 100", and 100'" as well as magnetic junctions 200, 200', 200", and 200'" have been disclosed. Note that various features of the magnetic substructures 100, 100', 100", and 100'" and the magnetic junctions 200, 200', 200", and 200'" may be combined. Thus, one or more of the benefits of the magnetic substructures 100, 100', 100", and 100'" and the magnetic junctions 200, 200', 200", and 200'" such as reduced write error rate, a perpendicular anisotropy, thermal stability, and/or scalability may be achieved.

A method and system for providing a magnetic substructure, a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic junction for use in a magnetic device comprising:
 a pinned layer;
 a nonmagnetic spacer layer; and
 a free layer, the nonmagnetic spacer layer residing between the pinned layer and the free layer;
 wherein the magnetic junction is configured such that the free layer is switchable between a plurality of stable magnetic states when a write current is passed through the magnetic junction; and
 wherein at least one of the pinned layer and the free layer includes a magnetic substructure, the magnetic substructure including at least two magnetic layers interleaved with at least one insertion layer, the at least two magnetic layers being exchange coupled, the at least two magnetic layers being configured such that a total magnetic moment of the magnetic substructure includes an in-plane component and a perpendicular-to-plane component.

2. The magnetic junction of claim 1 wherein the at least two magnetic layers include a first magnetic layer having a weak in-plane anisotropy and a second magnetic layer having a high perpendicular anisotropy.

3. The magnetic junction of claim 2 wherein the weak in-plane anisotropy includes a demagnetization field minus a perpendicular anisotropy, the perpendicular anisotropy being less than the demagnetization field.

4. The magnetic junction of claim 3 wherein the perpendicular anisotropy is at least 0.4 multiplied by the demagnetization field and not more than 0.9 multiplied by the demagnetization field.

5. The magnetic junction of claim 2 wherein the second ferromagnetic layer includes a demagnetization energy and a perpendicular anisotropy energy corresponding to the high perpendicular anisotropy, the perpendicular anisotropy energy exceeding the demagnetization energy.

6. The magnetic junction of claim 2 wherein the magnetic substructure has a desired exchange coupling, the insertion layer has a thickness tailored to provide the desired exchange coupling.

7. The magnetic junction of claim 1 wherein the at least two magnetic layers includes a third magnetic layer wherein the at least one insertion layer includes a second insertion layer adjoining the third magnetic layer.

8. The magnetic junction of claim 1 wherein the free layer includes the magnetic substructure.

9. The magnetic junction of claim 1 wherein the pinned layer includes the magnetic substructure.

10. The magnetic junction of claim 1 wherein both the pinned layer and the free layer include the magnetic substructure.

11. The magnetic junction of claim 2 further comprising:
an additional nonmagnetic layer; and
an additional pinned layer, the nonmagnetic layer residing between the free layer and the additional pinned layer.

12. The magnetic junction of claim 11 wherein the additional pinned layer includes an additional magnetic substructure having at least two additional magnetic layers interleaved with at least one additional insertion layer, the at least two additional magnetic layers being exchange coupled.

13. A magnetic memory comprising:
a plurality of magnetic storage cells, each of the plurality of magnetic storage cells including at least one magnetic junction, the at least one magnetic junction including a pinned layer, a nonmagnetic spacer layer, and a free layer, the nonmagnetic spacer layer residing between the pinned layer and the free layer, the magnetic junction being configured such that the free layer is switchable between a plurality of stable magnetic states when a write current is passed through the magnetic junction, at least one of the pinned layer and the free layer includes including a magnetic substructure, the magnetic substructure including at least two magnetic layers interleaved with at least one insertion layer, the at least two magnetic layers being exchange coupled, the at least two magnetic layers being configured such that a total magnetic moment of the magnetic substructure includes an in-plane component and a perpendicular-to-plane component; and
a plurality of bit lines.

14. The memory of claim 13 wherein the at least two magnetic layers include a first magnetic layer having a weak in-plane anisotropy and a second magnetic layer having a high perpendicular anisotropy.

15. The memory of claim 14 wherein the weak in-plane anisotropy includes a demagnetization field minus a perpendicular anisotropy, the perpendicular anisotropy being less than the demagnetization field.

16. The memory of claim 15 wherein the perpendicular anisotropy is at least 0.4 multiplied by the demagnetization field and not more than 0.9 multiplied by the demagnetization field.

17. The memory of claim 13 wherein the second ferromagnetic layer includes a demagnetization energy and a perpendicular anisotropy energy corresponding to the high perpendicular anisotropy, the perpendicular anisotropy energy exceeding the demagnetization energy.

18. The memory of claim 14 wherein the magnetic substructure has a desired exchange coupling, the insertion layer has a thickness tailored to provide the desired exchange coupling.

19. The memory of claim 13 wherein the at least two magnetic layers includes a third magnetic layer wherein the at least one insertion layer includes a second insertion layer adjoining the third magnetic layer.

20. The memory of claim 13 wherein the free layer includes the magnetic substructure.

21. The memory of claim 13 wherein the pinned layer includes the magnetic substructure.

22. The memory of claim 13 wherein both the pinned layer and the free layer include the magnetic substructure.

23. The memory of claim 14 further comprising:
an additional nonmagnetic layer; and
an additional pinned layer, the nonmagnetic layer residing between the free layer and the additional pinned layer.

24. The memory of claim 14 wherein the additional pinned layer includes an additional magnetic substructure having at least two additional magnetic layers interleaved with at least one additional insertion layer, the at least two additional magnetic layers being exchange coupled.

25. A method for providing a magnetic junction for use in a magnetic device comprising:
providing a pinned layer;
providing a nonmagnetic spacer layer; and
providing a free layer, the nonmagnetic spacer layer residing between the pinned layer and the free layer;
wherein the magnetic junction is configured such that the free layer is switchable between a plurality of stable magnetic states when a write current is passed through the magnetic junction; and
wherein at least one of the step of providing the pinned layer and the step of providing free layer includes providing a magnetic substructure, the magnetic substructure including at least two magnetic layers interleaved with at least one insertion layer, the at least two magnetic layers being exchange coupled, the at least two magnetic layers being configured such that a total magnetic moment of the magnetic substructure includes an in-plane component and a perpendicular-to-plane component.

26. The magnetic junction of claim 1 wherein each of the at least one insertion layer includes at least one of Cr, Ta, Ti, W, Ru, V, Cu, Mg, aluminum oxide, and MgO.

27. The magnetic junction of claim 1 wherein each of the at least one insertion layer consists of one of Cr, Ta, Ti, W, Ru, V, Cu, Mg, aluminum oxide, and MgO.

28. The magnetic junction of claim 1 wherein each of the at least two magnetic layers has a demagnetization field and a perpendicular anisotropy and the insertion layer consists of at least one of Cr, Ta, Ti, W, V, Mg, aluminum oxide, and MgO.

29. The magnetic junction of claim 12 wherein each of the at least one additional insertion layer includes at least one of Cr, Ta, Ti, W, Ru, V, Cu, Mg, aluminum oxide, and MgO.

30. The memory of claim 13 wherein each of the at least one insertion layer includes at least one of Cr, Ta, Ti, W, Ru, V, Cu, Mg, aluminum oxide, and MgO.

31. The memory of claim 13 wherein each of the at least one insertion layer consists of one of Cr, Ta, Ti, W, Ru, V, Cu, Mg, aluminum oxide, and MgO.

32. The memory of claim 13 wherein each of the at least two magnetic layers has a demagnetization field and a perpendicular anisotropy and the insertion layer consists of at least one of Cr, Ta, Ti, W, V, Mg, aluminum oxide, and MgO.

33. The memory of claim 24 wherein each of the at least one additional insertion layer includes at least one of Cr, Ta, Ti, W, Ru, V, Cu, Mg, aluminum oxide, and MgO.

34. The method of claim 25 wherein each of the at least one insertion layer includes at least one of Cr, Ta, Ti, W, Ru, V, Cu, Mg, aluminum oxide, and MgO.

35. The method of claim 25 wherein each of the at least one insertion layer consists of one of Cr, Ta, Ti, W, Ru, V, Cu, Mg, aluminum oxide, and MgO.

36. A magnetic junction for use in a magnetic device comprising:
a pinned layer;
a nonmagnetic spacer layer; and
a free layer, the nonmagnetic spacer layer residing between the pinned layer and the free layer;
wherein the magnetic junction is configured such that the free layer is switchable between a plurality of stable magnetic states when a write current is passed through the magnetic junction; and
wherein at least one of the pinned layer and the free layer includes a magnetic substructure, the magnetic substructure including at least two magnetic layers interleaved with at least one insertion layer, the at least two magnetic layers being exchange coupled, the at least two magnetic layers including a first magnetic layer having a weak in-plane anisotropy and a second magnetic layer having a high perpendicular anisotropy, the weak in-plane anisotropy includes a first demagnetization field minus a first perpendicular anisotropy, the first perpendicular anisotropy being less than the first demagnetization field, the second ferromagnetic layer including a second demagnetization energy and a second perpendicular anisotropy energy corresponding to the high perpendicular anisotropy, the second perpendicular anisotropy energy exceeding the second demagnetization energy, the at least two magnetic layers being configured such that a total magnetic moment of the magnetic substructure includes an in-plane component and a perpendicular-to-plane component.

37. The magnetic junction of claim 36 wherein the first perpendicular anisotropy is at least 0.4 multiplied by the first demagnetization field.

38. The magnetic junction of claim 36 wherein the first perpendicular anisotropy is not more than 0.9 multiplied by the first demagnetization field.

* * * * *